United States Patent [19]
Meltser

[11] Patent Number: 5,945,229
[45] Date of Patent: Aug. 31, 1999

[54] PATTERN RECOGNITION MONITORING OF PEM FUEL CELL

[75] Inventor: Mark Alexander Meltser, Pittsford, N.Y.

[73] Assignee: General Motors Corporation, Detroit, Mich.

[21] Appl. No.: 08/807,559

[22] Filed: Feb. 28, 1997

[51] Int. Cl.⁶ .............................. H01M 8/00; H01M 8/04
[52] U.S. Cl. ................................... 429/13; 429/23
[58] Field of Search ................................ 429/13, 23, 22, 429/12, 17

[56] References Cited

U.S. PATENT DOCUMENTS

| | | |
|---|---|---|
| 3,753,780 | 8/1973 | Fetterman . |
| 4,904,548 | 2/1990 | Tajima ........................................ 429/22 |
| 5,085,949 | 2/1992 | Sanderson et al. ........................ 429/23 |
| 5,712,052 | 1/1998 | Kawatsu ..................................... 429/13 |
| 5,763,113 | 6/1998 | Meltser et al. ............................ 429/13 |

*Primary Examiner*—Maria Nuzzolillo
*Assistant Examiner*—Jonathan Crepeau
*Attorney, Agent, or Firm*—Lawrence B. Plant

[57] ABSTRACT

The CO-concentration in the $H_2$ feed stream to a PEM fuel cell stack is monitored by measuring current and voltage behavior patterns from an auxiliary cell attached to the end of the stack. The auxiliary cell is connected to the same oxygen and hydrogen feed manifolds that supply the stack, and discharges through a constant load. Pattern recognition software compares the current and voltage patterns from the auxiliary cell to current and voltage signature determined from a reference cell similar to the auxiliary cell and operated under controlled conditions over a wide range of CO-concentrations in the $H_2$ fuel stream.

9 Claims, 4 Drawing Sheets

PATTERN RECOGNITION MONITORING OF PEM FUEL CELL

The Government of the United States of American has rights in this invention pursuant to Contract No. DE-AC02-90CH10435 awarded by the United States Department of Energy.

TECHNICAL FIELD

This invention relates to method and apparatus for monitoring PEM fuel cell stacks, and initiating corrective action when undesirable stack operating conditions are indicated.

BACKGROUND OF THE INVENTION

Fuel cells had been proposed as a power source for many applications. So-called PEM (proton exchange membrane) fuel cells [a.k.a. SPE (solid polymer electrolyte) fuel cells] potentially have high energy and low weight, and accordingly are desirable for mobile applications (e.g., electric vehicles). PEM/SPE fuel cells are well known in the art, and include a "membrane electrode assembly" (a.k.a. MEA) comprising a thin, proton transmissive, solid polymer membrane-electrolyte having an anode on one of its faces and a cathode on the opposite face. The membrane-electrode-assembly is sandwiched between a pair of electrically conductive elements which serve as current collectors for the anode and cathode, and contain appropriate channels and/or openings therein for distributing the fuel cell's gaseous reactants over the surfaces of the respective anode and cathode catalysts. The channels/openings for the reactants are often referred to as "flow channels". A plurality of individual cells are commonly bundled together to form a PEM fuel cell stack.

PEM fuel cells are typically $H_2$—$O_2$ fuel cells wherein hydrogen is the anode reactant (i.e., fuel) and oxygen is the cathode oxidant. The oxygen can either be in a pure form (i.e., $O_2$), or air (i.e., $O_2$ admixed with $N_2$). The solid polymer membranes are typically made from ion exchange resins such as perfluorinated sulfonic acid. One such resin is NAFION™ sold by E. I. DuPont deNemours & Co. Such membranes are well known in the art and are described in U.S. Pat. Nos. 5,272,017 and 3,134,697, and in Journal of Power Sources, Volume 29 (1990), pages 367–387, inter alia. The anode and cathode themselves typically comprise finely divided carbon particles, very finely divided catalytic particles supported on the internal and external surfaces of the carbon particles and proton conductive resin intermingled with the catalytic and carbon particles. One such membrane electrode assembly and fuel cell is described in U.S. Pat. No. 5,272,017 issued Dec. 21, 1993 and assigned to the assignee of the present invention.

PEM fuel cell performance can degrade for a number of reasons such as carbon monoxide poisoning of the anode catalyst, which can occur when the CO-concentration in the $H_2$ feed stream exceeds about 20 PPM. It is desirable to have an advance warning of any such impending condition to prevent damage to the stack and trigger early corrective action.

SUMMARY OF THE INVENTION

The present invention contemplates method and apparatus for monitoring the performance of a stack of PEM fuel cells, and automatically triggering corrective action (e.g., alert operator and/or initiate preventive procedures) when the performance of the of the cells indicates the early stages of one or more undesirable operating conditions (e.g., high CO concentration) that portends future stack difficulties (e.g. CO poisoning). The fuel cell stack comprises a plurality of individual fuel cells including a pair of end cells at opposite ends of the stack. Each cell comprises (1) a proton exchange membrane (e.g., NAFION™) having an anode and cathode affixed to opposing first and second surfaces of the membrane, (2) a first flow channel adjacent the anode for passing hydrogen into contact with the anode, and (3) a second flow channel adjacent the cathode for flowing oxygen (preferably as air) into contact with the cathode. The stack includes an oxygen-feed manifold and an hydrogen-feed manifold for supplying oxygen and hydrogen to the respective second (i.e., oxygen) flow channel and first (i.e., hydrogen) flow channel.

More specifically, the present invention contemplates monitoring the current through, and voltage across, a constant load connected to a discrete auxiliary fuel cell which is separate from the fuel cells constituting the stack, but operated under the same conditions as the stack's cells. The auxiliary cell is coupled to the oxygen-feed and hydrogen-feed manifolds so that the auxiliary cell will operate under the same temperature, pressure, CO-concentration, $H_2$ flow rate, and humidity conditions as the stack's cells operate. The auxiliary cell, like the stack's cells, has an anode and cathode affixed to opposite sides of a proton exchange membrane and confront flow channels that receive hydrogen and oxygen from the hydrogen-feed and oxygen-feed manifolds supplying the stack. The auxiliary cell's current and voltage are measured and plotted over a predetermined time interval to provide a current behavior pattern and a voltage behavior pattern. These behavior patterns are then compared to current and voltage signatures which have been previously generated empirically from a reference cell which is similar to the auxiliary cell and has been discharged through a test load which has the same resistance as the constant load connected to the auxiliary cell. For example, the reference cell is operated over a wide range of known CO-concentrations in the $H_2$ feed stream to develop a library of signatures corresponding to different CO-concentrations. Several (e.g., 30 or more) test runs are made for each of the CO-concentrations, and the several signatures obtained for each concentration are averaged to yield an average signature for each CO-concentration. A tolerance or allowable deviation is then assigned to each averaged signature, and the average signatures (i.e., with allowable tolerance) are then compared to the current and voltage behavior patterns generated by the auxiliary cell. A substantial match between the auxiliary cell's pattern and a signature from the reference cell provides knowledge about the CO-concentration, which knowledge is used to predict when undesirable operating conditions (e.g., anode poisoning) are likely to occur in the stack. The voltage and current behavior patterns of the auxiliary cell are compared to the voltage and current signatures provided by the reference fuel cell using conventional pattern recognition technology. When abnormal or undesirable stack operating conditions are evident, corrective measures are initiated such as alerting the stack's operator of impending problems, and/or automatically initiating preventive procedures to avoid or mitigate future problems with the stack.

To increase the sensitivity of the auxiliary cell, the electrodes of the auxiliary cell will preferably have a lower catalyst loading (i.e. $g/cm^2$) than the stack's cells. Preferably, the surface area of the electrodes in the stack's cells is greater than the surface area of the auxiliary cell's electrodes. Most preferably, the surface area of the auxiliary cell's electrodes will be less than about 10% that of the stack's electrodes, and the catalyst loading will be about half the catalyst loading in the stack's cells.

The auxiliary cell preferably abuts an end cell in the stack. Most preferably, the auxiliary cell is separated from the end cell by an electrically conductive bipolar plate. The auxiliary cell includes a pair of terminals for withdrawing electrical current from the auxiliary cell, which current is caused to flow through a constant electrical load connected across the terminals. A voltage sensing device senses any voltage fluctuations across the constant load over a predetermined time interval and outputs a voltage signal which represents the behavior pattern of the voltage fluctuations over that interval. A current sensing device senses any current fluctuations through the constant load over a predetermined time interval and outputs a signal which represents the behavior pattern of the current fluctuations over that interval. A first data processing device serves as a data acquisition unit, and, using conventional technology, samples the current and voltage signals, conditions the signals to filter out signal noise, and converts them to digital data streams. A suitable memory device stores predetermined voltage and current signatures which have been determined empirically from a reference cell similar to the auxiliary cell. These signatures are characteristic of auxiliary cells operating under a known constant electrical load and certain known operating conditions such as varying CO-concentrations. Finally, a second data processing device (e.g., a personal computer) receives the digital data streams, plots a curve of the behavior pattern of the voltage and current fluctuations over a given time interval, and compares those voltage and current behavior patterns to the signatures determined from the reference cell in order to match, or otherwise identify, at least one of the signatures that is substantially similar to the behavior pattern being compared. Based on the known operating condition of cells that produce a matching such signature, the operating condition of the stack is determined. Any such condition (e.g., high CO-concentrations) that portends future stack difficulties (e.g. CO poisoning) can be identified and corrective action can be initiated. In addition to high CO-concentrations, other operating conditions that could also be tracked using the pattern recognition principle of this invention include $H_2O$ flooding of the cathode, improper humidification, improper pressurization, and over heating, inter alia.

Processwise, a preferred embodiment of the invention contemplates a method for monitoring the operating conditions of a stack of $H_2$—$O_2$ PEM fuel cells, such as described above, and triggering corrective action when the early stages of an undesirable operating condition are indicated. The process comprises the steps of: (i) discharging the auxiliary fuel cell described above through a constant electrical load; (ii) sensing voltage fluctuations across the constant load over a predetermined time interval during the discharge, and generating a voltage signal representative of the behavior pattern of those voltage fluctuations over that interval; (iii) sensing current fluctuations through the load over a predetermined time interval during the discharge, and generating a current signal representative of the behavior pattern of those current fluctuations over that interval; (iv) converting the voltage and current signals to digital data streams; (v) from a reference fuel cell similar to the auxiliary fuel cell and discharging through a test load having the same resistance as the constant electrical load across the auxiliary cell, determining a plurality of voltage and current signatures over a wide range of known operating conditions (e.g., CO-concentrations in the $H_2$ feed stream); (vi) storing the voltage and current signatures in a readable memory; (vii) comparing the voltage behavior patterns from the auxiliary fuel cell to the voltage signatures of the reference fuel cell to identify at least one of the voltage signatures that is substantially similar to the voltage behavior pattern being compared; (viii) comparing the current behavior patterns from the auxiliary fuel cell to the current signatures of the reference fuel cell to identify at least one of the current signatures that is substantially similar to the current behavior pattern being compared; and (ix) issuing a warning if a behavior pattern is substantially similar to a signature that is indicative of the early stages of an undesirable operating condition (e.g., high CO-concentrations) that portends future operating difficulties (e.g., anode poisoning) for the stack.

BRIEF DESCRIPTION OF THE DRAWINGS

The invention will be better understood when considered in the light of the following detailed description thereof which is given hereafter in conjunction with the following drawings of which.

DESCRIPTION OF THE PREFERRED EMBODIMENT

Figure 1:
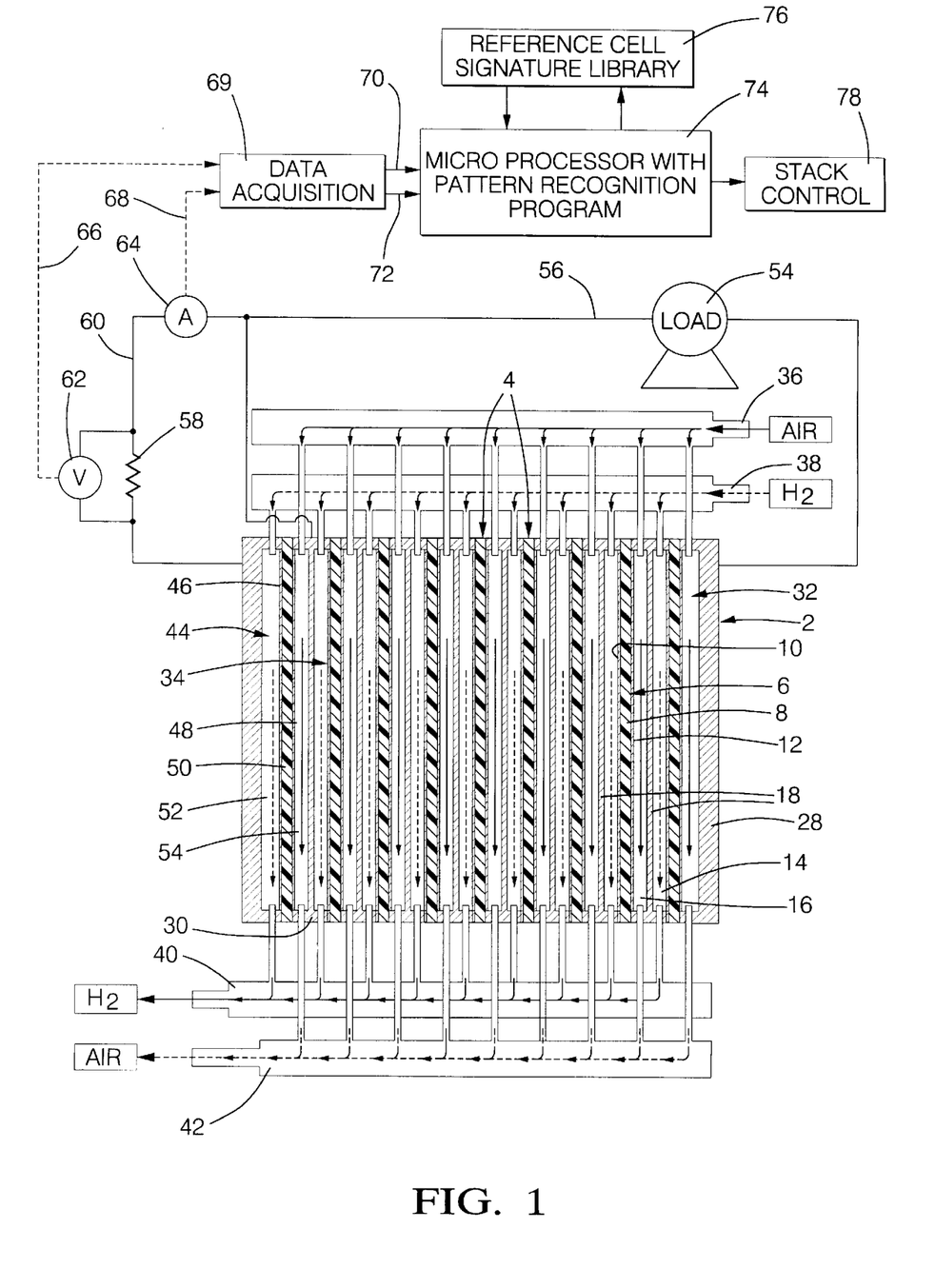
FIG. 1 is a schematic illustration of a bipolar, PEM fuel cell stack, and auxiliary fuel cell monitoring system therefor in accordance with the present invention.

FIG. 1 depicts a stack 2 of individual fuel cells 4 each comprising a MEA 6 having a proton conductive resin membrane 8 sandwiched between an anode 10 on one surface thereof and a cathode 12 on the opposite surface thereof. A cathode flow channel 16 is provided adjacent the cathode 12 for flowing an oxygen-rich gas (i.e., preferably air) by, and into contact with, the cathode 12. Similarly, an anode flow channel 14 is provided adjacent the anode 10 for flowing hydrogen fuel by, and into contact with, the anode 10. The membrane 8 will preferably comprise a perfluoronated sulfonic acid polymer such as NAFION™ as is well known in the PEM fuel cell art. Each individual cell 4 is separated from the next cell 4 in the stack by a bipolar plate 18, which is a conductive plate (e.g., metal, carbon, etc.) which separates the several cells one from the next while conducting electrical current in electrical series directly from one cell to the next. The bipolar plates 18 each have a plurality of ribs 20 and 22 (see FIGS. 2 and 3) on opposite faces thereof defining the flow channels and engaging the cathode 12 and anode 10 respectively, for supporting the MEA and collecting current therefrom. The ribs 20 and 22 define a plurality of grooves 24 and 26 respectively through which the $H_2$ and $O_2$ flow across the anode and cathode surfaces. End plates 28 and 30 terminate the stack 2 and define the respective cathode and anode flow channels for the end cells 32 and 34 of the stack 2. An oxygen-feed manifold 36 supplies air to the several cathode flow channels 16. Similarly, a hydrogen-feed manifold 38 supplies hydrogen fuel to the several anode flow channels 14. A hydrogen exhaust manifold 40 collects anode exhaust gas from the several anode flow channels 14 and recirculates it back to the hydrogen feed manifold 38 for reuse. Similarly, a cathode exhaust gas manifold 42 collects exhaust gas from the cathode flow channels 16.

Stack performance can degrade for a number of reasons including carbon monoxide poisoning of the anode catalyst. Such poisoning is a potential problem when there is excess (i.e., more than about 20 PPM) CO in the hydrogen-feed stream which can result from inefficient methanol/hydrocarbon reforming, shift and/or PROX reactions known to artisans skilled in this art. When the presence of excess CO is evident, efforts must be made to correct the problem at its source. Decontamination of anode catalyst that has already been contaminated by the CO is also advisable. To decontaminate the catalyst, hydrogen flow to the anode is discontinued when the stack is idle, and air/$O_2$ pumped through the anode flow channel 14 to purge the CO from anode catalyst. When the CO has been purged from the catalyst, the air/$O_2$ flow is discontinued, the anode flow channel purged of the air/$O_2$ (e.g., with nitrogen), and finally the hydrogen flow reestablished.

The present invention is directed to method and apparatus for monitoring the performance of a PEM fuel cell stack in such a manner as to be able to detect when undesirable operating conditions (e.g., high CO-concentrations in the $H_2$) exist that portend major future stack difficulties (e.g., anode poisoning), and to initiate corrective action when such action is warranted. Pattern recognition technology provides a means for reliably measuring low levels of CO concentration in substantially real time. An auxiliary fuel cell 44 is provided whose electrical performance, under constant load conditions, has been correlated to the electrical performance of a substantially identical reference fuel cell whose electrical performance under certain operating conditions is known. Thereafter, monitoring the electrical performance of the auxiliary cell 44 and comparing it to the expected performance under known conditions provides a direct knowledge of ongoing operating conditions of the cells 4 comprising the stack 2. From this knowledge, the time when future stack difficulties are is likely to occur can be predicted. Like the cells that comprise the stack 2, the auxiliary cell 44 includes an anode 46 and cathode 48 on the opposite surfaces of a proton exchange membrane 50. The auxiliary fuel cell 44 is attached to the end of the stack 2 so as to abut the end plate 30 of the stack 2 such that the end plate 30 functions as a bipolar plate separating the anode 10 of the end cell 34 from the cathode 48 of the auxiliary cell 44. The auxiliary cell 44 includes an anode flow channel 52 which communicates with the hydrogen-feed manifold 38, and a cathode flow channel 54 which communicates with the oxygen-feed manifold 36 such that the anode flow channel 52 and the cathode flow channel 54 are exposed to the hydrogen-feed stream and the oxygen-feed stream at the same temperature, pressure, CO-concentration in the $H_2$ feed stream, and humidity as the fuel cells that comprise the stack 2.

Figure 2:
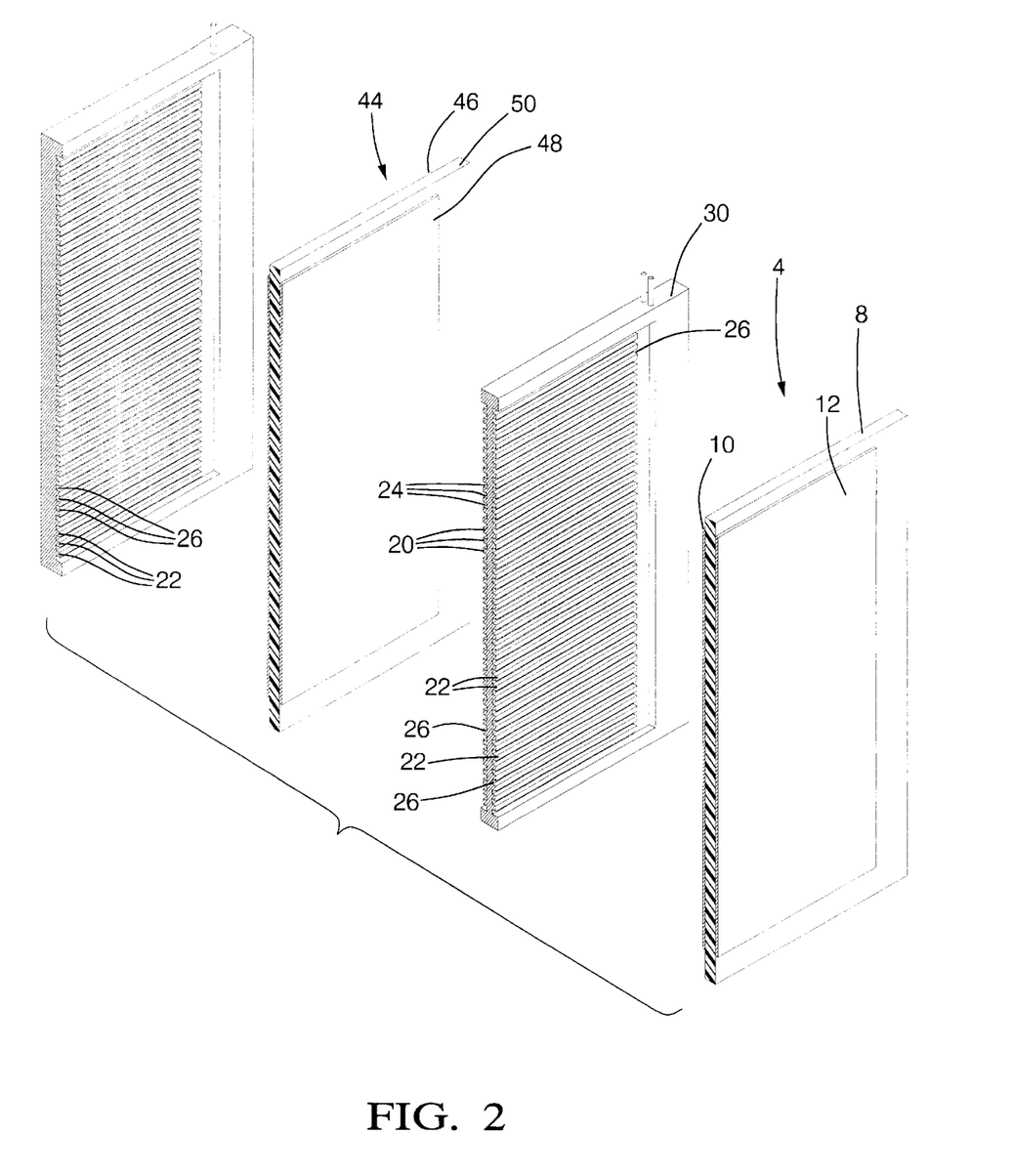
FIG. 2 illustrates an exploded, sectioned, perspective view of a stack fuel cell and abutting auxiliary fuel cell according to one embodiment of the present invention.
Figure 3:
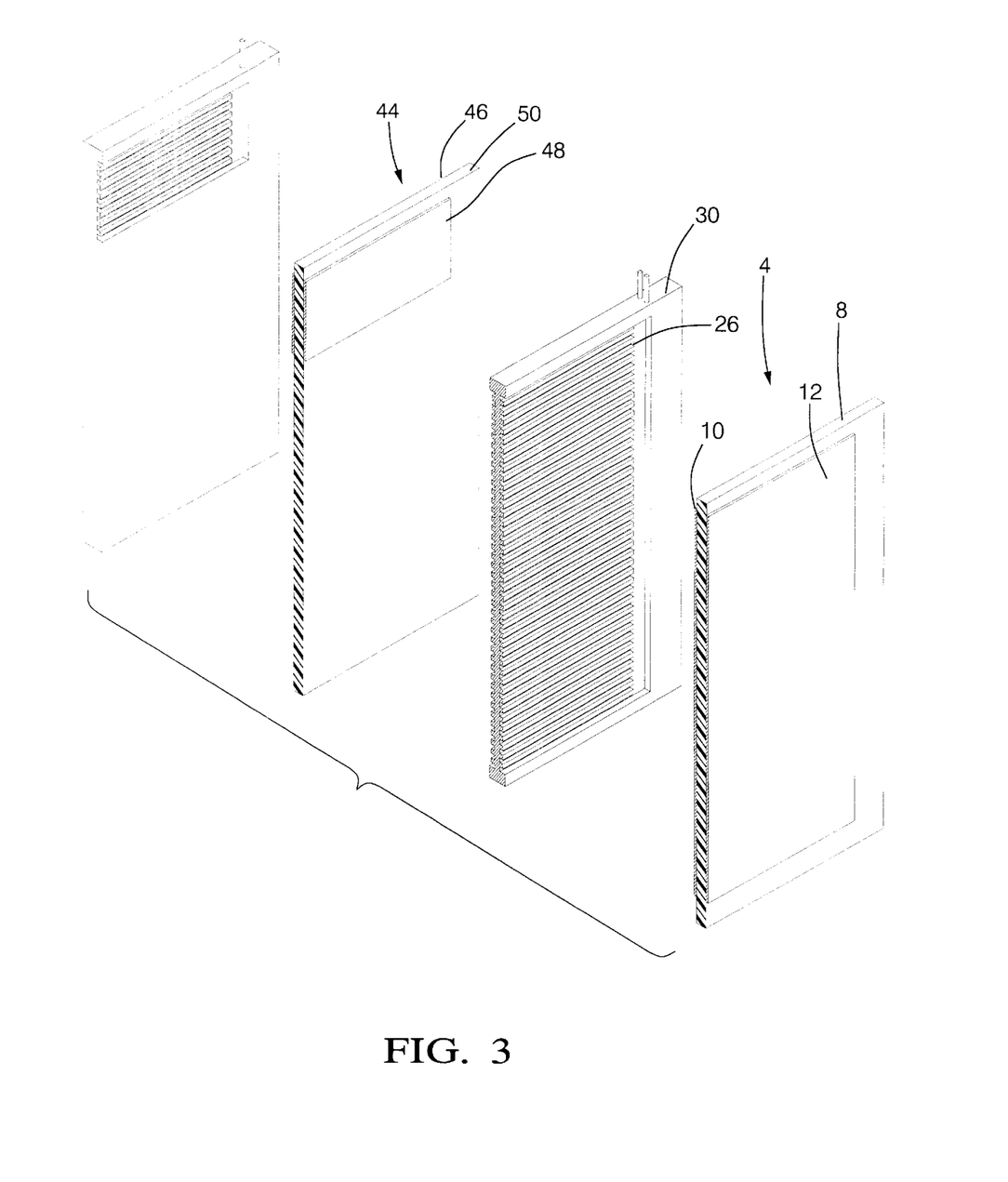
FIG. 3 illustrates an exploded, sectioned, perspective view of a stack fuel cell and abutting auxiliary cell in accordance with another embodiment of the present invention.

As best shown in FIG. 2, the auxiliary cell 44 may be essentially identical to the cells 4 that make up the stack 2. Preferably, the auxiliary cell 44 will have a lower catalyst loading than the stack cells 4 to increase its sensitivity to low CO-concentrations. Most preferably and as best shown in FIG. 3, individual cells 4 comprising the stack 2 will have anodes 10 and cathodes 12 whose surface areas are much greater (e.g., as much as 10× greater) than the surface areas of the anode 46 and cathode 48 of the auxiliary cell 44. This, coupled with lower catalyst loadings, provides an auxiliary cell with heightened CO-concentration sensitivity. By way of example, an $H_2$—$O_2$ PEM fuel cell stack 2 having individual cells 4 with about 100 in² of electrode area, can be effectively monitored with an auxiliary cell 44 having an electrode area of about 1 in² to 2 in², and about one half the catalyst loading (i.e. g/cm²) of the stack cells 4. Such a reduced area auxiliary cell 44 need only discharge through a constant load of 0.6 ohms to be effective. The auxiliary cell 44 will typically operate with closed circuit voltages of about 0.6 to about 0.9 volts and currents of about 1 to 2 amps.

As best shown in FIG. 1, the stack 2 is electrically connected to an electrical load 54 such as the traction motors of an electric vehicle. Such loads vary significantly depending on driving conditions. Because of the varying load 54, monitoring the voltage and current flow in the circuit 56 cannot be used as a reliable indicator of the CO-concentration in the $H_2$ stream. The auxiliary cell 44, on the other hand, is coupled to a constant load 58 via circuit 60. A voltage sensing device 62 (e.g., voltmeter) senses the voltage across the load 58 while a current sensing device 64 (e.g., ammeter) senses the current flowing in the circuit 60. The voltage sensing device 62 may be any such device as is well known in the art and is capable of outputting a signal 66. The current sensing device 64, on the other hand, may either be (1) a discrete such device as is well known in the art and is capable of outputting a signal 68, or (2) may be the voltage sensing device 62 from which current can automatically be calculated using Ohm's law. The output signals 66 and 68 of voltage sensing device 62 and current sensing device 64 respectively are inputted into a conventional high speed analog to digital converter 69 (i.e., data acquisition unit) which conditions the signal to eliminate noise, and generates digital data streams 70 and 72. The converter 69 will preferably operate at a speed of at least 1000 Hz since very high sampling rates are needed to measure second and third order effects in patterns. A preferred such high speed converter useful for this purpose is a SCU-4 data acquisition system sold by Generic Instruments and Systems Corporation (GenIAS™), as it is capable of reading inputted data, and making all computations, in real time.

The current and the voltage are both sampled on a regular basis (e.g., every 10 to 100 milliseconds). The resulting signals are conditioned, and the average voltage and current are plotted over a specified interval of time e.g. from about 100 milliseconds to about 10,000 milliseconds. These plots depict the behavior patterns for the voltage and the current over that time interval. These behavior patterns are inputted as data streams 70 and 72 into the data processor 74 where they are compared to predetermined reference current signatures and voltage signatures stored in memory 76. The reference voltage and current signatures are empirically determined beforehand from a reference cell which is similar to the auxiliary cell 44, is discharged through a constant load having the same value as the constant load 58 across the auxiliary cell 44, and is operated over a wide range of carbon monoxide concentrations (normal and abnormal) in the $H_2$ feed stream. A large library of such signatures is stored in the memory 76, and is available for the comparison to the voltage and current behavior patterns produced by the auxiliary cell 44. The voltage behavior pattern and the current behavior pattern of the auxiliary cell 44 are compared to each of the many reference voltage and current signatures on file in the memory 76 until at least one of the reference current signatures closest to the behavior pattern of the auxiliary cell's current is identified, and/or one of the reference voltage signatures closest to the behavior pattern of the auxiliary cell's voltage is identified. Once a "match" is made between a reference signature and a behavior pattern, the CO-concentration in the $H_2$ feed stream is determined from which the "time-to-poisoning" can be estimated if the concentration is abnormally high. A perfect match between the behavior patterns and the signatures is not necessary. Rather, a suitable match will be found if the signature is substantially similar to the behavior pattern with which it is being compared. By "substantially similar" is meant a degree of similarity that falls within certain pattern recognition tolerances that the stack designer or operator can include in the pattern recognition software to be described hereafter. These tolerances permit a "match" to be made even though the signature and the pattern are not identical.

The data processor 74 includes a common digital computer with associated read-only memory (ROM), read-write random access memory (RAM), electrically programmable read-only memory (EPROM), memory for storing a library of predetermined reference current and voltage signatures for comparing to voltage and current patterns produced by the auxiliary cell 44, and input/output sections which interface with the A-D converter 69 and a stack control module 78 that controls the operation of the stack 2. The read-only memory (ROM) of the digital computer contains the instructions necessary to implement the basic input/output instructions. The electrically programmable read-only memory (EPROM) contains the instructions necessary to implement the data processor's own internal control, data manipulation, and communication algorithms. The processor 74 communicates with the A-D converter 69 and the control module 78 by means of any appropriate communication network protocol, many of which are known in the art. A standard 486 or Pentium computer with 16 meg of RAM, Running Windows® 3.1 or Windows® 95, and fitted with an ACB 530 bus control board is adequate for this purpose. A specific program for carrying out the functions of the processor 74 may be accomplished by standard skill in the art using conventional information processing languages.

Pattern recognition programs are known in the art and have been used for numerous applications such as to (1) identify sea creatures from their acoustic patterns, (2) identify body hormonal changes from sensor measurements, (3) identify the fracture point in a tool using vibration patterns, (4) identify land vehicles from their acoustic and seismic signatures, (5) identify wear patterns in materials from thickness measurements, (6) identify intruders in secure areas using microwave and IR measurements (7) identify automotive intrusion from shock and acoustic patterns, and (8) identify faulty power-seat assemblies from acoustic patterns, inter alias. Preferred pattern recognition software for the fuel cell monitoring technique of the present invention is essentially analog pattern recognition software which, based on current and voltage measurements taken periodically over specified time intervals, is capable of creating voltage and current behavior patterns that can be compared to reference current and voltage signatures within a defined tolerance range. From such comparisons, the carbon monoxide concentration in the $H_2$ feed stream to the stack can be determined, and therefrom the remaining useful life of the stack can be predicted before the anode is poisoned. A preferred such pattern recognition software is commercially available under the name Failure/Wear Predictor™ (FWP)™ commercially available from the GenIAS™, supra. The FWP™ software has embedded therein GEN-MATCH™ software (also sold by GenIAS™), which is a programmable analog pattern recognition program which can simultaneously measure an arbitrary number of pattern features, and includes three different tolerances for addressing several features of a pattern rather than just a single feature (e.g., a peak) thereof. That software consists of a template-matching process based on a reference signature created in advance from a reference cell operated under controlled conditions. It is neither amplitude-sensitive nor time-sensitive in that input signals over wide dynamic ranges (e.g., microvolts to volts taking place over periods from nanoseconds to minutes) are normalized to just 600 dimensionless units in amplitude (Y axis) and 2000 dimensionless units in time (X axis). Following normalization of the signals, an accumulated slope, known as "anglesum", is computed for each of the 2000 data points of the normalized input data while traversing the signal contour. Anglesum is proportional to the accumulated slope of the curve in such a way that as the curve increases along a positive slope the anglesum increases in magnitude, and as the curve decreases along a negative slope the anglesum decreases in magnitude. The pattern recognition process utilizes the anglesum values, within defined tolerances, as defined in the reference signatures. In this regard, all reference signatures contain a series of intervals wherein anglesum values and tolerances are used to characterize each interval. These intervals are the discriminating factors used for signal recognition. If the intervals from the reference "match" (i.e., with consideration of all tolerances) like intervals in the behavior patterns from the auxiliary cell, a "match" is declared and identification is complete. The program uses two interval types for its recognition process: so-called "key" and "standard" intervals. The key intervals allow phase adjustment of the reference signatures to the behavior patterns from the auxiliary cell as well as a first pass discrimination by the recognition process. The standard intervals are then used for the remaining recognition process. Key intervals are selected for uniqueness and serve to minimize search/comparison time through the reference signature database as well as to phase align the reference intervals with the data being identified. Hence, key intervals allow the software to quickly ascertain whether the behavior pattern contains the initial characteristics required by the reference signature. If the characteristics of the key intervals are found in the auxiliary cell pattern, a full comparison is initiated using the remaining standard intervals. Standard intervals are, by definition, all intervals other than the key intervals. For the auxiliary cell's behavior pattern to contain the characteristics of the reference key intervals, it must satisfy two criteria. First, the anglesum values of the reference signatures must match corresponding anglesum values in the auxiliary cell's pattern, within the same intervals. Second, the separation (number of data points apart) of the two intervals must be the same as that in the reference signature. Hence, it is both the intervals and their separation which determine a match.

The reference signature template consists of a series of signal intervals to which both X and Y tolerances are assigned. Each signature can be divided into as many as 2000 segments each of which is bounded by a signal maximum and minimum. The behavior of the signal between segment boundaries is modeled by a measurement including amplitude change, average rate of amplitude change, and instantaneous rate of amplitude change. Tolerances can be assigned in three areas, for each segment, i.e., so-called "anglesum tolerance", "bit tolerance" and "masking tolerance". Bit tolerance identifies the number of elements (points) beyond the start and end points of the specified reference interval within which the matching process searches for an anglesum match. For example, consider a reference interval with start and end points at data elements 65 and 135, respectively, and a bit tolerance of 5. The matching process will then look at anglesum values in the signal pattern with start and end points of (60, 130), (61, 131), (62, 132), (63, 133), (64, 134), (65, 135), (66, 136), (67, 137), (68, 138), (69, 139), and (70, 140), when trying to match with the reference interval anglesum. If the bit tolerance=0, then the anglesum of the corresponding interval in the data is compared directly to the anglesum of the corresponding interval in the reference pattern. Anglesum tolerance provides an allowance for variation in the anglesum values being compared. This tolerance dictates the allowable error in anglesum values between an interval in a reference signature and a corresponding interval in the auxiliary cell's data set. Consider a reference interval with start point at 65 and end point at 135 with an anglesum value=100, bit tolerance=0, and anglesum tolerance=5. The intervals will match if the anglesum for the signal data interval starting at 65 and ending at 135 is within the range of 95≦signal anglesum≦105. Masking tolerance stipulates the number of non-matching intervals that can exist and still provide recognition. For example, consider a reference pattern with 30 intervals a masking tolerance equal to 5. If the number of reference intervals found to match corresponding intervals in the signal data set is ≧25 there is a match. Otherwise, the reference signature does not match the auxiliary cell's behavior pattern.

During the matching process, the software moves the reference signature segment (the template) back and forth along the X-axis within the limits set by the bit tolerance. The software looks for a match with a data segment from the auxiliary cell's behavior patterns having an anglesum between the selected upper and lower tolerance limits. Essentially then, the matching process is as follows: (1) a specified width of voltage and current data is extracted from the auxiliary cell; (2) this data is normalized to an anglesum of 600 points, and an element composition of 2000 points; (3) the reference signature template is moved across the data set from the auxiliary cell; (4) when a match is found with certain key intervals, the template and auxiliary cell data sets are locked in phase, and each data set is jittered in phase along the X-axis looking for the anglesum match; and (5) if the number of data segments specified by the masking tolerance is met, the auxiliary cell data set is considered to match the template. When such a match is made, the CO-concentration in the $H_2$ feed stream is determined. Moreover, when abnormal conditions are evident (e.g., high CO-concentration), the time to poisoning of the stack is calculated by the software based on a target set by the stack designer or operator. In this latter regard, the software accepts voltage ($V_A$) and current ($I_A$) measurement inputs from the auxiliary cell 44, measures changes in the behavior patterns embedded in those measurements, computes a stack degradation-factor for CO poisoning, and extrapolates the degradation-factor to the limit set by the stack's designer/operator as being the point where corrective action needs to be taken. Impending CO poisoning may be displayed via colored LEDS, indicated audibly (e.g. a buzzer) or corrective procedures may be automatically initiated through the control module 78 for the stack.

Figure 4:
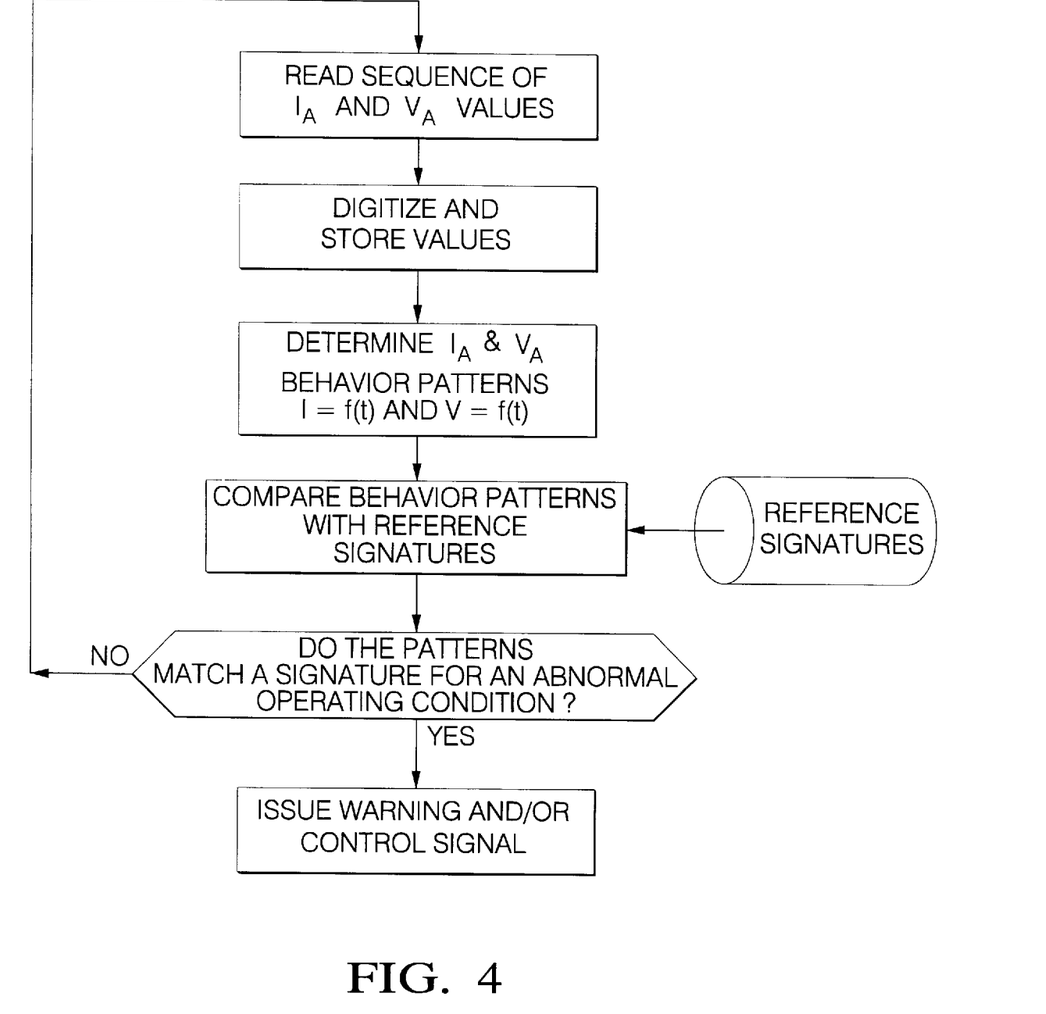
FIG. 4 is a flow diagram of the process of the present invention.

The processor 74 is programmed to perform the process depicted in FIG. 4. That is to say, digitized voltage ($V_A$) and current ($I_A$) values from the data acquisition unit 69 are fed to the processor 74 which calculates the behavior patterns thereof as I=f(t) and V=f(t) over a predetermined increment of time. These behavior patterns are then compared to the reference signatures stored in memory 76. If a behavior pattern and a reference signature substantially match (as described above) a warning to the operator, or control signal to the stack control module 78 is issued to take corrective action. The processor electronically periodically repeats the process according to a predetermined rhythm or pattern. That is to say, every so many milliseconds (e.g. about 1 to 3 seconds), all of the steps shown in FIG. 4 are repeated. The frequency with which these steps are repeated may vary considerably, and will preferably be relatively infrequent when the auxiliary cell (and hence the stack) is operating under normal, steady state conditions and no imminent trouble is indicated. However, when the early stages of a potentially troublesome condition is evident (e.g., CO-concentration in the H₂ stream rises), the frequency with which the steps are repeated will increase so that the developing condition can be monitored more effectively.

The apparatus and process described above can be used to identify and track the progress of a variety of operating conditions that can affect the performance of a PEM fuel cell. Hence for example, in addition to tracking CO-concentrations in the H₂ stream as discussed above, the pattern recognition technique of the present invention can also be used to track such other operating conditions as $H_2O$ flooding of the cathode, improper humidification, improper stack pressurization, over heating etc. $H_2O$ flooding of the cathode, for example, is troublesome and results from excessive water building up on the cathode side of the MEA where $H_2O$ normally forms during the fuel cell's discharge reaction. If not enough $H_2O$ is removed therefrom by the cathode air stream, the $H_2O$ effectively drowns the catalyst and reduces its effectiveness to catalyze the $O_2$ reaction. If flooding does occur, the condition can be cured, and its affects can be minimized, by periodically flowing excess air through the cathode flow channel until the cathode dries sufficiently.

While the invention has been disclosed in terms of a specific embodiment thereof it is not intended to be limited thereto, but rather only to the extent set forth hereafter in the claims which follow.

I claim:

1. In a fuel cell system comprising (a) a stack of PEM $H_2$—$O_2$ fuel cells each comprising a proton exchange membrane having an anode and a cathode affixed to opposing first and second surfaces thereof, a first flow channel adjacent said anode for flowing hydrogen into contact with said anode, and a second flow channel adjacent said cathode for flowing an oxygen-bearing gas into contact with said cathode, said stack having a first end cell at one end of said stack, a second end cell at the opposite end of said stack, and a plurality of additional cells intermediate said end cells, (b) an oxygen-feed manifold supplying oxygen to said cells, (c) a hydrogen-feed manifold supplying hydrogen to said cells, and (d) an external electrical device having a variable electrical load connected to said end cells for receiving electrical current from said stack for operating said device, the improvement comprising:

(i) an auxiliary PEM $H_2$—$O_2$ fuel cell having third and fourth flow channels respectively receiving hydrogen from said hydrogen-feed manifold and oxygen from said oxygen-feed manifold under the same temperature, pressure, CO-concentration, and humidity conditions as the cells of said stack, said auxiliary cell comprising a pair of terminals for withdrawing electrical current from said auxiliary cell;
    (ii) a constant electrical load connected to said terminals;
    (iii) a voltage sensing device for sensing voltage fluctuations across said constant load over a time interval and outputting a voltage signal having a behavior pattern indicative of said voltage fluctuations;
    (iv) a current sensing device for sensing current fluctuations through said constant load over a time interval and outputting a current signal having a behavior pattern indicative of said current fluctuations; and
    (v) a monitor receiving said voltage and current signals, comparing the behavior patterns of such signals to reference voltage and current signatures indicative of the operating condition of the auxiliary cell, and automatically initiating corrective action to protect said stack when at least one of said behavior patterns indicates a condition that is detrimental to the stack.

2. In a fuel cell system comprising (a) a stack of PEM $H_2$—$O_2$ fuel cells each comprising a proton exchange membrane having an anode and a cathode affixed to opposing first and second surfaces thereof, a first flow channel adjacent said anode for flowing hydrogen into contact with said anode, and a second flow channel adjacent said cathode for flowing an oxygen-bearing gas into contact with said cathode, said stack having a first end cell at one end of said stack, a second end cell at the opposite end of said stack, and a plurality of additional cells intermediate said end cells, (b) an oxygen-feed manifold supplying oxygen to said cells, (c) a hydrogen-feed manifold supplying hydrogen to said cells, and (d) an external electrical device having a variable electrical load connected to said end cells for receiving electrical current from said stack for operating said device, the improvement comprising:

(i) an auxiliary PEM $H_2$—$O_2$ fuel cell having an anode and cathode affixed to opposite sides of a proton exchange membrane and confronting third and fourth flow channels respectively receiving hydrogen from said hydrogen-feed manifold and oxygen from said oxygen-feed manifold under the same temperature, pressure, CO-concentration, and humidity conditions as the cells of said stack, said auxiliary cell having had its electrical performance under varying operating conditions correlated to the physical condition of said stack and comprising a pair of terminals for withdrawing electrical current from said auxiliary cell;
    (ii) a constant electrical load connected to said terminals;
    (iii) a voltage sensing device for sensing voltage fluctuations across said constant load over a time interval and outputting a voltage signal having a behavior pattern indicative of said voltage fluctuations;
    (iv) a current sensing device for sensing current fluctuations through said constant load over a time interval and outputting a current signal having a behavior pattern indicative of said current fluctuations;
    (v) a data processing device for sampling said signals and converting them to a digital data stream representing said behavior patterns;
    (vi) a memory device for storing reference values representing voltage and current signatures which are characteristically produced from an auxiliary cell discharging through said constant electrical load and known to have a particular physical condition, said signatures having been derived empirically from a reference cell similar to said auxiliary cell which has been discharged through a constant load having the same value as said constant load and operated under a variety of cell operating conditions; and
    (vii) a data processing device (a) receiving said digital data stream, (b) comparing said voltage and current behavior patterns to said signatures to identify at least one of said signatures that is substantially similar to the behavior pattern being compared and (c) automatically initiating corrective action to protect said stack if said one of said behavior patterns portends future damage to said stack.

3. A fuel cell system according to claim 2 wherein said auxiliary fuel cell abuts one of said end cells.

4. A fuel cell system according to claim 3 wherein one of said third and fourth flow channels of said auxiliary cell is separated from one of said first and second flow channels of one of said end cells by a partition.

5. A fuel cell system according to claim 4 wherein said partition comprises an electrically conductive bipolar plate.

6. A fuel cell system according to claim 1 wherein the surface areas of the anode and cathode in each of the fuel cells in said stack are greater than the surface areas of the anode and cathode of the auxiliary cell, and the anode and cathode of said auxiliary cell have catalyst loadings which are less than the catalyst loadings of the anodes and cathodes of the fuel cells in said stack.

7. A fuel cell system according to claim 1 wherein the anodes and cathodes for the cells in said stack each includes a first and second catalyst respectively, and the anode and cathode of said auxiliary cell each includes a third and fourth catalyst respectively, said third and fourth catalysts being compositionally different than said first and second catalysts.

8. A method for monitoring the performance of a stack of $H_2$—$O_2$ PEM fuel cells and initiating corrective action when operating conditions indicate the need for said action, said stack having an oxygen-feed manifold and a hydrogen-feed manifold supplying oxygen and hydrogen respectively to said cells, said manifolds being coupled to an auxiliary $H_2$—$O_2$ PEM fuel cell so as to supply said auxiliary fuel cell with oxygen and hydrogen at the same temperature, pressure, CO-concentration, and humidity as said oxygen and hydrogen are supplied to said fuel cells in said stack, comprising the steps of:

(i) discharging said auxiliary fuel cell through a constant electrical load;

(ii) sensing voltage fluctuations across said constant load over a time interval during said discharge, and generating a voltage signal having a voltage behavior pattern indicative of said voltage fluctuations;

(iii) sensing current fluctuations through said load over a time interval during said discharge, and generating a current signal having a current behavior pattern indicative of said current fluctuations;

(iv) converting said signals to a digital data stream;

(v) from a reference fuel cell similar to said auxiliary fuel cell and discharging through a test load having the same resistance as said constant electrical load, determining a plurality of reference voltage and current signatures which are correlated to specific known operating conditions of the reference fuel cell;

(vi) storing said reference voltage and current signatures in readable memory;

(vii) comparing the voltage behavior patterns from said auxiliary fuel cell to the voltage signatures of said reference fuel cell to identify at least one of said voltage signatures that is substantially similar to the voltage behavior pattern being compared;

(viii) comparing the current behavior patterns from said auxiliary fuel cell to the current signatures of the reference fuel cell to identify at least one of said current signatures that is substantially similar to the current behavior pattern being compared; and (ix) automatically initiating corrective action to protect said stack if a said behavior pattern is substantially similar to a said signature that is indicative of an operating condition that is detrimental to the stack.

9. A method according to claim 8 wherein the fuel cell stack operating condition being monitored is CO poisoning of the anode.

* * * * *